United States Patent [19]

Ohta

[11] Patent Number: 4,472,730
[45] Date of Patent: Sep. 18, 1984

[54] SEMICONDUCTOR DEVICE HAVING AN IMPROVED MOISTURE RESISTANCE

[75] Inventor: Toshio Ohta, Tokyo, Japan

[73] Assignee: Nippon Electric Co., Ltd., Tokyo, Japan

[21] Appl. No.: 333,508

[22] Filed: Dec. 22, 1981

[30] Foreign Application Priority Data

Dec. 29, 1980 [JP] Japan ................. 55-188204

[51] Int. Cl.³ .................. H01L 23/30; H01L 23/28; H01L 23/48; H01L 29/34
[52] U.S. Cl. ........................ 357/73; 357/53; 357/54; 357/68; 357/71; 357/72
[58] Field of Search ............ 357/73, 72, 71, 68, 357/54, 53

[56] References Cited

U.S. PATENT DOCUMENTS

| 4,005,455 | 1/1977 | Watrous, Jr. et al. | 357/71 |
| 4,204,894 | 5/1980 | Komeda et al. | 357/54 |
| 4,273,805 | 6/1981 | Dawson | 357/54 |

FOREIGN PATENT DOCUMENTS

| 52-21782 | 2/1977 | Japan | 357/73 |
| 52-32270 | 3/1977 | Japan | 357/68 |
| 54-14672 | 2/1979 | Japan | 357/54 |
| 55-27644 | 2/1980 | Japan | 357/54 G |
| 2027273A | 2/1980 | United Kingdom | 357/54 N |

OTHER PUBLICATIONS

H. R. Gates et al., "Forming Openings in an Insulating Layer", *IBM Technical Disclosure Bulletin*, vol. 10, (1967), p. 323.

Primary Examiner—William D. Larkins
Assistant Examiner—J. Carroll
Attorney, Agent, or Firm—Sughrue, Mion, Zinn Macpeak & Seas

[57] ABSTRACT

In a plastic or resin encapsulated semiconductor device, the bonding pad electrodes cannot be covered by a waterproof film. Moisture easily penetrates the plastic or resin coating and/or the boundary between the coating and the bonding wire reaching the phosphorus silicate glass under the bonding pad electrode. This penetrated moisture produces phosphoric acid which in turn corrodes the bonding pad electrodes. The present invention prevents the corrosion of the bonding pad electrodes by eliminating the phosphorus silicate glass under the bonding pad electrode or by separating the bonding pad electrode from the phosphorus silicate glass.

11 Claims, 6 Drawing Figures

SEMICONDUCTOR DEVICE HAVING AN IMPROVED MOISTURE RESISTANCE

BACKGROUND OF THE INVENTION

The present invention relates to a semiconductor device, and more particularly to the structure of a resin-sealed semiconductor device.

The reliability of a semiconductor device, especially of an insulated gate field effect IC device such as a MOS IC device, the operation of which relies upon a semiconductor substrate surface phenomenon, often is determined mainly by the surface condition of the semiconductor device. Where the semiconductor substrate is hermetically encapsulated within a ceramic casing, impurities in the atmosphere within the casing are kept at a low level and the humidity within the casing is suppressed to keep the surface condition of the substrate clear. Furthermore, in such a device, the surface of the substrate is usually coated with a silicon oxide film formed using a chemical vapor deposition (CVD) process to thus prevent penetration of impurities and thereby suppress variations in the electrical characteristics of the device.

Although this $SiO_2$ coating is fully effective as a protective film when a ceramic casing is employed, it is known that, if a plastic or resin casing is used instead of a ceramic casing, variations in electrical characteristics may in fact occur. This is due to the fact that the casing itself contains impurities such as sodium ions ($Na+$) or the like (generally in an epoxy resin such ions are present in a proportion of about 100 ppm). Where the casing itself directly contacts the surface of semiconductor device elements formed in the substrate, the $Na+$ ions permeate through the $SiO_2$ protective coating, resulting in variations in the electrical characteristics of the device.

The use of a plastic or resin casing thus gives rise to a problem in reliability over a long period of use; however, on the other hand, a plastic casing possesses a number of advantages such as ease of mass productivity and low cost. In order to overcome the above mentioned problem and to provide plastic casings having the same degree of reliability as ceramic casings, various surface protective films have been investigated.

In recent years, a thin film of low concentration phosphorus silicate glass (PSG) or silicon nitride ($Si_3N_4$) has begun to be used as the surface protective film. If the thickness and the growing temperature of such thin films are appropriately selected, the film exhibits a sufficient protection against impurities such as $Na+$ ions or the like, even if the semiconductor element is encased in plastic or resin, so that it has become possible to obtain a highly reliable IC which does not have degraded characteristics, even if it is continuously operated at a high temperature of 125° C. This protective film is similarly effective against moisture, and can prevent corrosion of aluminum wiring or interconnection layers and the accompanying generation of surface leakage current which is caused by moisture penetrating along boundaries between the plastic or resin coating and the lead electrodes.

However, it is essentially impossible even for such an excellent protective film to cover an aluminum bonding pad where a metallic fine wire (generally a gold wire of about 30 μm in diameter) is bonded. Since the protective film must be removed from the upper surface of the bonding pad to form an aperture, the moisture resisting ability of the coating is reduced by the presence of this aperture.

SUMMARY OF THE INVENTION

It is therefore a principal object of the present invention to provide a semiconductor device encapsulated with plastic or resin and having a high moisture resistance.

The present invention is based upon a new finding that moisture penetrating through a plastic or resin coating and/or along a boundary between the plastic or resin coating and the lead electrodes onto the bonding pad electrode and passing through grain boundaries in the bonding pad electrode reacts with high concentration PSG which is normally positioned under the bonding pad electrode as a barrier against $Na+$ ions. This reaction produces phosphoric acid which corrodes the aluminum bonding pad electrode. In other words, by preventing the high concentration PSG from contacting penetrated moisture, a highly reliable semiconductor device which has excellent moisture resistance and which is free from surface leakage is provided.

In particular, the present invention is based on a new discovery that a plastic or resin-encapsulated semiconductor device having excellent moisture resistance and which can easily be mass produced can be provided by interposing a waterproof insulating film between an aluminum bonding pad electrode in an aperture portion and the high concentration PSG, and by removing the high concentration PSG film under the bonding pad electrode, or by forming an insulating film having a smaller phosphorus content under the bonding pad electrode.

According to the present invention, there is provided a semiconductor device having at least one semiconductor element formed on a semiconductor substrate and coated with a protective insulating film, in which the phosphorus content of an insulating film under a bonding pad electrode is smaller than a phosphorus content of an insulating film under a wiring electrode.

If the phosphorus content of the insulating film exceeds a saturation value, phosphorus atoms contained in the insulating film react with penetrated moisture to produce phosphoric acid. Accordingly, if PSG having a high concentration of 15 to 20 mol % or more of phosphorus is employed under an aluminum wiring or interconnection layer, the PSG under the bonding pad electrode should have a low phosphorus concentration of 8 to 10 mol % or less. To that end, initially a PSG film having a high phosphorus concentration of 15 to 20 mol % or more is formed, and then only in the area where the bonding pad electrode is to be formed, the surface portion of the high concentration PSG film is removed so that the surface phosphrous concentration of the PSG film left in that portion is reduced to 8 to 10 mol % or less. Alternatively, the low concentration PSG film can be separately formed only in the area where a bonding electrode is to be formed. A more preferable method is to remove the high concentration PSG film down to a field insulating film that is normally formed on the semiconductor substrate (i.e. a silicon dioxide film whose phosphorus content is nearly zero), or to use a small phosphorus content insulating film such as a silicon nitride film interposed between the PSG film and the bonding pad electrode as a separator therebetween.

According to the present invention, there is also provided a semiconductor device composed of a semiconductor substrate of one conductivity type, an insulating film including a silicon dioxide layer formed on the semiconductor substrate and a phosphorus silicate glass layer on the silicon dioxide layer, an impurity region of the opposite conductivity type formed in an active region adjacent to the insulating film, an aluminum wiring layer connected to the impurity region and extending over the phosphorus silicate glass layer, a first aperture formed in the phosphorus silicate glass layer and extending to the silicon dioxide layer, an aluminum bonding pad electrode making contact with the silicon dioxide layer in the first aperture and connected to the aluminum wiring layer, a surface protective film coating over the aluminum wiring layer, a surface protective film coating over the aluminum wiring layer and the phosphorus silicate glass layer and having a second aperture extending to the bonding pad electrode, and a metal wire connected to the bonding pad electrode within the second aperture in the surface protective film.

According to the present invention, there is also provided a semiconductor device composed of a semiconductor substrate of one conductivity type, an insulating film including a silicon dioxide layer formed on the semiconductor substrate and a phosphorus silicate glass layer on the silicon dioxide layer, an impurity region of the opposite conductivity type formed in an active region adjacent to the insulating film, an aluminum wiring layer connected to the impurity region and extending over the phosphorus silicate glass layer, an island-like silicon nitride film provided on the phosphorus silicate glass layer, an aluminum bonding pad electrode provided on the silicon nitride film and connected to the aluminum wiring layer, a surface protective film coating over the aluminum wiring layer and the phosphorus silicate glass layer and having an aperture extending to the bonding pad electrode, and a metal wire connected to the bonding pad electrode within the aperture in the surface protective film.

The size of the bonding pad electrode should be smaller than the size of the aperture area in the high concentration PSG layer or the island-like silicon nitride film area, while the distance between each edge of the bonding pad electrode and the opposed edge of the aperture in the high concentration PSG layer or the silicon nitride island ranges favorably from 20 $\mu$m to 50 $\mu$m. On the other hand, the size of the bonding pad electrode should be larger than the size of the aperture in the surface protective film, while the distance between each edge of the bonding pad electrode and the corresponding edge of the aperture in the protective film ranges favorably from 5 $\mu$m to 10 $\mu$m.

DESCRIPTIONS OF THE PREFERRED EMBODIMENTS

Figure 1:
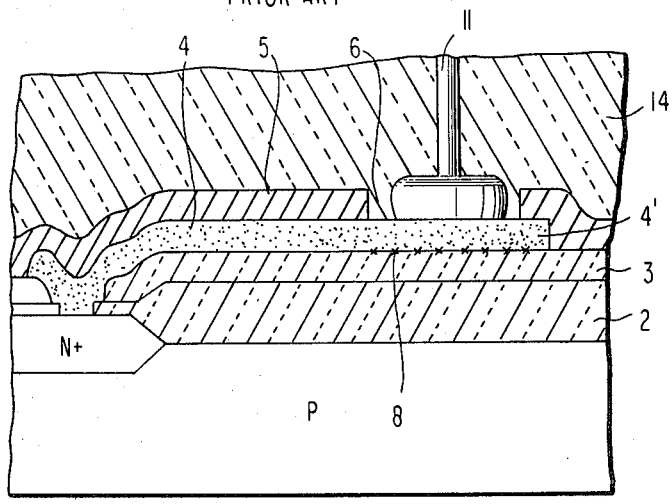
FIG. 1 is a cross-sectional view of a bonding portion of a semiconductor integrated circuit device of the prior art.

Referring to FIG. 1, an integrated circuit of the prior art includes a protective film 5 of low concentration PSG or silicon nitride disposed on a semiconductor substrate 1. An aperture 6 is formed in the protective film 5 by removing portions of the film in an area above a bonding pad electrode 4' of an aluminum layer where a fine metallic wire 11 is bonded. This aperture 6 generally has a square shape in plan view and an edge length of about 100 $\mu$m. The aluminum bonding pad electrode 4' is connected to an aluminum wiring layer and is exposed through the aperture 6. The bonding pad electrode 4' is electrically connected to an external electrode lead (not shown) through the fine metal wire 11, which may be made of gold or the like. The assembly is encapsulated by epoxy resin 14.

In such a construction, moisture can easily penetrate through the epoxy resin 14 and/or boundary between the epoxy resin 14 and the fine wire, onto the aluminum bonding pad electrode 4' and pass through grain boundaries in the aluminum electrode 4', to reach a high concentration PSG insulating layer 3 containing phosphorus of 15 to 20 mol % which is provided under the electrode 4' and above a silicon dioxide film 2. Consequently, the moisture reacts with phosphorus in the insulator layer 3 at a contact area 8 between the electrode 4' and the insulator layer 3 to produce phosphoric acid. As a result, the aluminum electrode 4' tends to be gradually corroded beginning from this contact area 8 by the phosphoric acid and is eventually broken off. Therefore, even if the surface of the semiconductor element is coated with a protective film 5 having an excellent waterproofing characteristic such as a PSG film of low phosphorus concentration or a silicon nitride film, since the moisture resistance of the device is determined as a practical matter by the aperture portion 6 provided for wire-bonding, it has been impossible to realize a resin or plastic encapsulated semicondutor device having excellent moisture resistance.

Figure 2A:
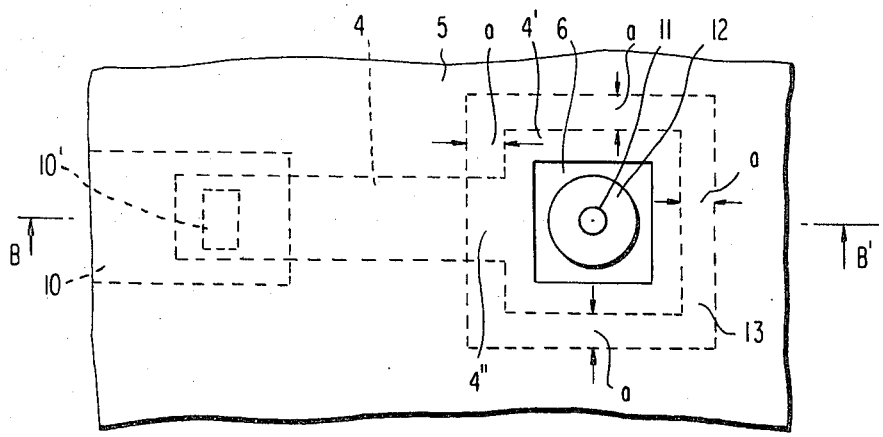
FIG. 2A is a plan view of a bonding portion of a first preferred embodiment of the present invention.
Figure 2B:
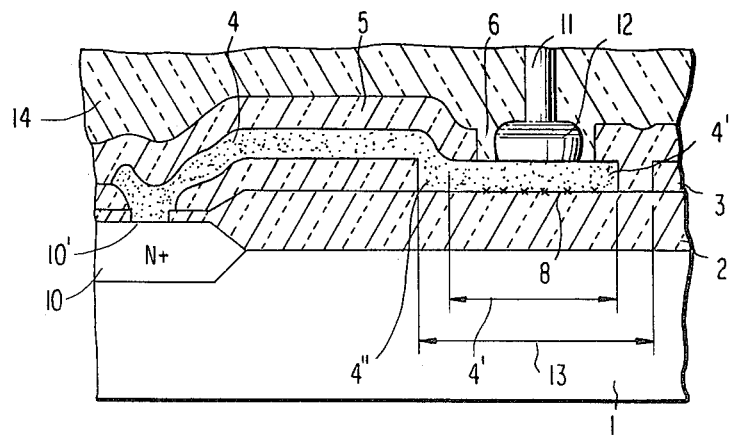
FIG. 2B is a cross-sectional view taken along line B—B' in FIG. 2A as viewed in the direction of arrows shown in FIG. 2A.

Referring to FIGS. 2A and 2B, a first preferred embodiment of a semiconductor device having an improved moisture resistance of the present invention includes a P-type semiconductor substrate 1, a silicon dioxide layer 2 formed by thermal oxidation on one principal surface of the substrate 1 in such a manner as to be partially buried in the substrate in a field region surrounding an active region, and an insulating film 3 of a high concentration phosphorus silicate glass provided on the silicon dioxide layer 2 in the field region. The high concentration PSG is a better barrier against Na+ ions than low concentration PSG. The insulating film 3 preferably has a thickness of about 5000 Å and a phosphorus content of 15 to 20 mol %.

In an active region surrounded by the field region, an insulated gate field effect transistor having an N+-type drain region 10 is formed. An aluminum wiring layer 4 of 50 $\mu$m in width and 1.2 $\mu$m in thickness is connected to the N+-type drain region 10 of this transistor at a contact portion 10'. The aluminum wiring layer 4 extends over the high concentration PSG insulating layer 3 and contacts at its end portion 4" a bonding pad electrode 4' having a square shape in plan view having an edge length of approximately 100 μm. Around and under this bonding pad electrode 4', the high concentration PSG layer 3 is preliminarily removed in a square area that extends by a distance a of 20 μm to 50 μm beyond the respective edges of the bonding pad electrode 4' to form an aperture 13, as seen in FIGS. 2A and 2B. Accordingly, the bonding pad electrode 4' contacts the silicon dioxide layer 2 directly, and the high concentration PSG layer 3 is separated from the respective edges of the aluminum bonding pad electrode 4' by 20 μm to 50 μm. A surface protective film of silicon nitride or low concentration PSG having a thickness of 0.5 μm to 1.5 μm and a phosphorus concentration of 8 to 10 mol % or less is deposited in such a manner as to cover the surface of the structure. A bonding aperture 6 is formed in this protective film 5 to partially expose the upper surface of the bonding pad electrode 4', with each edge of the bonding pad electrode 4' being covered by the protective film 5 to a width of about 5 μm to 10 μm. A fine gold wire 11 of 30 μm in diameter is bonded to the bonding pad electrode 4' through the aperture 6. The wire 11 is pressed so as to be expanded to a diameter of 70 μm to 90 μm at the bonded end 12. Finally the thus assembled structure is encapsulated with epoxy resin 14.

According to the above-described embodiment, as compared to the prior art structure illustrated in FIG. 1, there is provided a highly reliable semiconductor device merely by adding the step of forming the aperture 13 in the high concentration PSG layer 3.

Under the bonding aperture 6 of the surface protective layer 5 of the semiconductor device, the high concentration PSG layer 3 is not present in the area directly under the bonding electrode 4'. Therefore, phosphoric acid will not be produced even if moisture should penetrate through the aperture 6 to the contact area 8 between the bonding pad electrode 4' and the silicon dioxide layer 2. Thus, there is provided a semiconductor device free from aluminum corrosion having an excellent moisture resistance.

Figure 4:
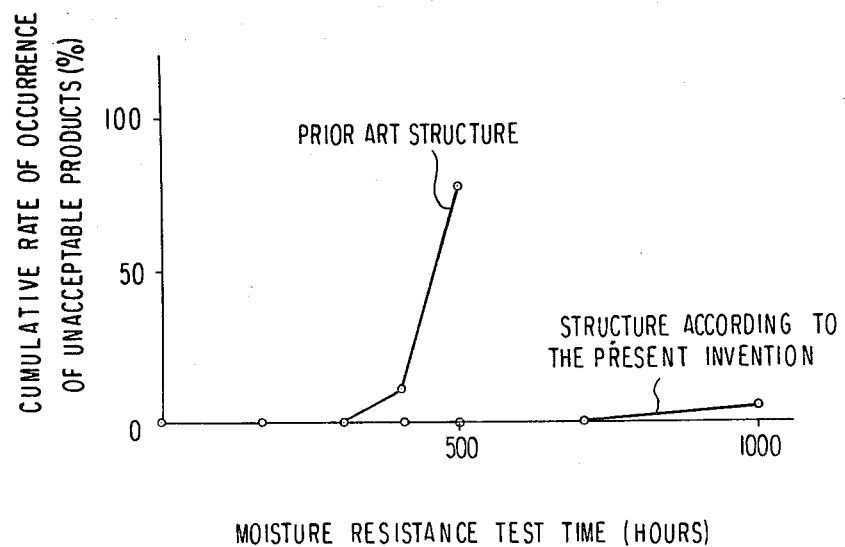
FIG. 4 is a characteristic diagram showing a cumulative rate of occurrence of unacceptable products under a moisture resistance test of MOS integrated circuit devices protected by a silicon nitride film of the prior art and MOS integrated circuit devices embodying the present invention.

FIG. 4 shows a result of a moisture resistance test and is a graph of unacceptable products for N-channel MOS integrated circuit devices. The tested devices were protected by a silicon nitride thin film and encapsulated with an epoxy resin, and included some having a bonding electrode structure of the prior art as illustrated in FIG. 1 and some having a bonding electrode structure according to the present invention as illustrated in FIGS. 2A and 2B. The test, which was a so-called "pressure cooker test", was carried out by placing the devices to be tested in a closed oven where they were exposed to steam at 125° C. and a pressure of about 2.5 atmospheres. As seen from FIG. 4, the devices having the structure according to the present invention could withstand the pressure cooker test for about 1000 hours or more without degradation of performance, whereas the number of failures in the group of the devices having the prior art structure increased rapidly after about 400 hours. After 500 hours, almost all the devices having the prior art structure were inoperative. Most of those unacceptable were found to have damaged bonding pad electrodes due to aluminum corrosion.

Figure 3A:
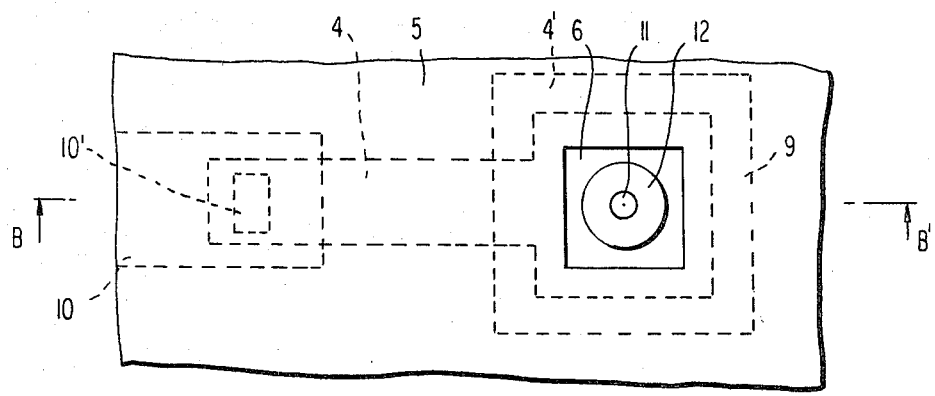
FIG. 3A is a plan view of a bonding portion of a second preferred embodiment of the present invention.
Figure 3B:
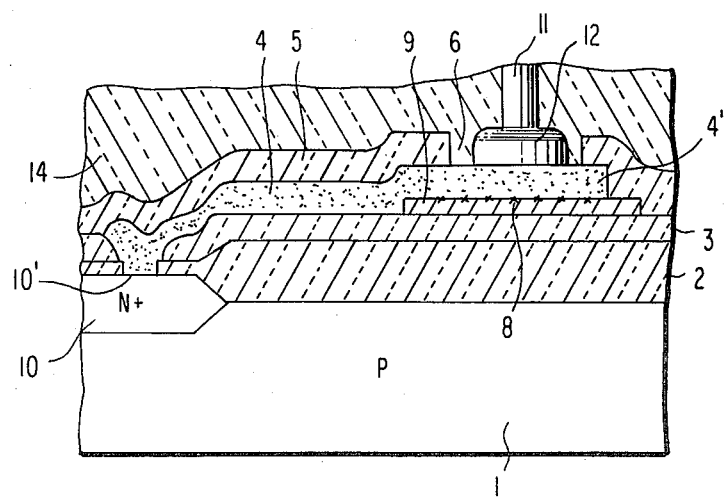
FIG. 3B is a cross-sectional view taken along line B—B' in FIG. 3A as viewed in the direction of arrows shown FIG. 3A.

A second preferred embodiment of the present invention is illustrated in FIGS. 3A and 3B, in which component parts having the same functions as those shown in FIGS. 2A and 2B are referred to by the same reference numerals. In this preferred embodiment, the high concentration PSG layer 3 extends even under the bonding pad electrode 4' without a portion thereof being removed. Instead, a layer of a material such as a silicon nitride layer having a slight moisture permeability is interposed between the high concentration PSG layer 3 and the bonding pad electrode 4'. This silicon nitride layer 9, which has a thickness of 500 to 1000 Å, has an island-like configuration with an area larger than that of the bonding pad electrode 4'. More particularly, the silicon nitride layer 9 has a square shape whose respective edges extend 20 μm to 50 μm beyond the corresponding edges of the bonding electrode 4'. Also in this modified embodiment, the same effects and advantages as the first preferred embodiment shown in FIGS. 2A and 2B are obtained.

As described above, the semiconductor device according to the present invention has a specific advantage that, even where the device is hermetically encapsulated in a plastic or resin casing, corrosion of aluminum electrodes caused by penetrating moisture does not occur, and hence the device has an excellent moisture resistance.

While the present invention has been described above with reference to a case where it is applied to MOS devices, it is obvious for those skilled in the art that the invention can be equally applied to bipolar and other types of semiconductor devices.

I claim:

1. A semiconductor device comprising: semiconductor substrate, an insulating film including a silicon dioxide layer formed on said semiconductor substrate and a phosphorus silicate glass layer on said silicon dioxide layer, an aluminum wiring layer connected to a region of said substrate and and extending over at least a portion of said phosphorus silicate glass layer, a first aperture formed in said phosphorus silicate glass layer to expose the surface of a portion of said silicon dioxide layer, an aluminum bonding pad electrode formed within said aperture of said phosphorus silicate glass layer and spaced from the adjacent walls of said phosphorus silicate glass layer in said aperture and directly contacting an exposed surface of said portion of said silicon dioxide layer, an aluminum connection layer formed within said first aperture and across one said wall of said phosphorus silicate glass layer and connecting said aluminum bonding pad to said aluminum wiring layer, a surface protective film coating over said aluminum wiring layer, said aluminum connection layer, said phosphorus silicate glass layer, and surface portions of said dioxide layer which remain exposed, and having a second aperture through which is exposed said bonding pad electrode, and a wire connected to said bonding pad electrode in said second aperture of said surface protective film.

2. A semiconductor device of claim 1, in which a distance between said bonding pad electrode and corresponding walls of the first aperture formed in said phosphorus silicate glass layer ranges from 20 μm to 50 μm.

3. A semiconductor device of claim 1, in which a distance between said bonding pad electrode and corresponding walls of the second aperture formed in said surface protective film ranges from 5 μm to 10 μm, a peripheral surface of said bonding pad electrode being covered by said surface protective film.

4. A semiconductor device comprising: a semiconductor substrate, an insulating film including a silicon dioxide layer formed on said semiconductor substrate and a phosphorus silicate glass layer on said silicon dioxide layer, an aluminum wiring layer connected to a region of said substrate and extending over at least a portion of said phosphorus silicate glass layer, an island-like silicon nitride film formed on said phosphorus silicate glass layer, and an aluminum bonding pad electrode formed on said silicon nitride film and connected to said aluminum wiring layer, a surface protective film over said aluminum wiring layer and said phosphorus silicate glass layer having an aperture through which is exposed said bonding pad electrode, and a metal wire connected to said bonding pad electrode in said aperture of said surface protective film.

5. A semiconductor device comprising: a semiconductor substrate having a major surface, an insulating layer formed on said major surface and having a first and a second surface portions, an aluminum wiring layer directly formed on said first surface portion of said insulating layer, and an aluminum bonding pad electrode directly formed on said second surface portion of said insulating layer and connected to said wiring layer, the phosphorus content of said second surface portion being smaller than that of said first surface portion, a surface protective film over said aluminum wiring layer and said first portion of said insulating layer and having an aperture through which is exposed said bonding pad electrode, and a metal wire connected to said bonding pad electrode in said aperture of said said surface protective film.

6. A semiconductor device of claim 5, in which said second surface portion comprises a silicon nitride layer.

7. A semiconductor device of claim 5, in which said second surface portion comprises a silicon oxide layer.

8. A semiconductor device of claim 5, in which the phosphorus content of said first surface portion is not less than 15 mol %, and the phosphorus content of said second surface portion is not more than 10 mol %.

9. A semiconductor device comprising: a semiconductor substrate, an insulating layer on said substrate, a first phosphosilicate layer containing 15 to 20 mol % phosphorus, an aluminum layer connected to a region of said substrate and extending over at least a portion of said first phosphosilicate layer, an aluminum bonding pad connected to said aluminum layer, a second phosphosilicate layer lying under said aluminum bonding pad and containing less than 10 mol % phosphorus, a surface protective film over said aluminum wiring layer and said first phosphosilicate layer and having an aperture through which is exposed said bonding pad electrode, and a metal wire connected to said bonding pad electrode in said aperture of said surface protective film.

10. A semiconductor device of claim 4, in which a surface area of said bonding pad electrode is smaller than a surface area of said island like silicon nitride film, the width of the peripheral portion of said silicon nitride film not covered by said bonding pad electrode ranging from 20 μm to 50 μm.

11. A semiconductor device of claim 4, in which a peripheral portion of the surface of said bonding pad electrode is covered by said surface protective film.

* * * * *

UNITED STATES PATENT AND TRADEMARK OFFICE
CERTIFICATE OF CORRECTION

PATENT NO.  : 4,472,730

DATED       : September 18, 1984

INVENTOR(S) : Toshio OHTA

It is certified that error appears in the above-identified patent and that said Letters Patent is hereby corrected as shown below:

Column 3, line 68, after "shown", insert --in--.

column 6, line 30, before "semiconduc-" insert --a--.

Signed and Sealed this

Ninth Day of July 1985

[SEAL]

Attest:

DONALD J. QUIGG

Attesting Officer   Acting Commissioner of Patents and Trademarks